US012556152B2

(12) United States Patent
Choi et al.

(10) Patent No.: US 12,556,152 B2
(45) Date of Patent: Feb. 17, 2026

(54) MICROWAVE PROVIDING APPARATUS, SYSTEM INCLUDING THE SAME, AND METHOD OF MANUFACTURING SEMICONDUCTOR DEVICE

(71) Applicant: SEMES CO., LTD., Cheonan-si (KR)

(72) Inventors: Yoonseok Choi, Suwon-si (KR); Hanlim Kang, Seoul-si (KR); Hyunwoo Jo, Hwaseong-si (KR); Sangjeong Lee, Hwaseong-si (KR)

(73) Assignee: SEMES CO., LTD., Cheonan-si (KR)

(*) Notice: Subject to any disclaimer, the term of this patent is extended or adjusted under 35 U.S.C. 154(b) by 119 days.

(21) Appl. No.: 18/129,735

(22) Filed: Mar. 31, 2023

(65) Prior Publication Data

US 2023/0402983 A1    Dec. 14, 2023

(30) Foreign Application Priority Data

Jun. 14, 2022  (KR) .................. 10-2022-0072339

(51) Int. Cl.
*H03H 1/00* (2006.01)
*H01J 37/32* (2006.01)
(Continued)

(52) U.S. Cl.
CPC ......... *H03H 1/00* (2013.01); *H01J 37/32192* (2013.01); *H01L 21/30621* (2013.01);
(Continued)

(58) Field of Classification Search
None
See application file for complete search history.

(56) References Cited

U.S. PATENT DOCUMENTS 6,228,773 B1 * 5/2001 Cox ..................... H01L 21/6719
118/719
2004/0222189 A1 * 11/2004 Fischer ............. H01J 37/32174
216/67
(Continued)

FOREIGN PATENT DOCUMENTS

JP        06-333697       12/1994
JP        2000-151214      5/2000
(Continued)

OTHER PUBLICATIONS

Chang ((2005). Encyclopedia of RF and Microwave Engineering, vols. 1-6—Bandstop Filters and Bandstop Filters. (pp. 494-499). John Wiley & Sons). (Year: 2005).*

(Continued)

*Primary Examiner* — Ram N Kackar
*Assistant Examiner* — Laureen Chan

(57) ABSTRACT

Provided is a system including a microwave source configured to generate microwaves, a branch apparatus including an input port connected to the microwave source, first and second chambers configured to process a wafer by using the microwaves, a first filter configured to transfer the microwaves to or cut off the microwaves from the first chamber, and connected to a first output port of the branch apparatus, and a second filter configured to transfer the microwaves to or cut off the microwaves from the second chamber, and connected to a second output port of the branch apparatus.

19 Claims, 2 Drawing Sheets

(51) Int. Cl.
- *H01L 21/306* (2006.01)
- *H01L 21/3065* (2006.01)
- *H01L 21/311* (2006.01)
- *H01L 21/67* (2006.01)

(52) U.S. Cl.
CPC .... *H01L 21/3065* (2013.01); *H01L 21/31122* (2013.01); *H01L 21/31138* (2013.01); *H01L 21/67069* (2013.01); *H01L 21/67155* (2013.01); *H01L 21/6719* (2013.01)

(56) References Cited

U.S. PATENT DOCUMENTS

| | | | | |
|---|---|---|---|---|
| 2005/0005853 | A1* | 1/2005 | Behle | H01J 37/32229 |
| | | | | 118/723 MW |
| 2012/0097524 | A1* | 4/2012 | Pipitone | H01J 37/34 |
| | | | | 204/192.1 |
| 2015/0007940 | A1* | 1/2015 | Kaneko | H01J 37/32201 |
| | | | | 118/723 AN |
| 2015/0118848 | A1* | 4/2015 | Draeger | H01L 21/76837 |
| | | | | 438/714 |
| 2016/0036113 | A1 | 2/2016 | Wu et al. | |
| 2016/0329621 | A1 | 11/2016 | Shahramian et al. | |
| 2018/0182634 | A1* | 6/2018 | Smith | H01J 37/32899 |
| 2022/0084795 | A1* | 3/2022 | Collins | C23C 16/45504 |

FOREIGN PATENT DOCUMENTS

| | | |
|---|---|---|
| JP | 2007-200687 | 8/2007 |
| JP | 2009-534850 | 9/2009 |
| KR | 10-2003-0021591 | 3/2003 |

OTHER PUBLICATIONS

Notice of Allowance from the Korean Intellectual Property Office dated Nov. 9, 2024.

Office Action from the Korean Intellectual Property Office dated Mar. 26, 2024.

* cited by examiner

MICROWAVE PROVIDING APPARATUS, SYSTEM INCLUDING THE SAME, AND METHOD OF MANUFACTURING SEMICONDUCTOR DEVICE

CROSS-REFERENCE TO RELATED APPLICATION

This application is based on and claims priority under 35 U.S.C. § 119 to Korean Patent Application No. 10-2022-0072339, filed on Jun. 14, 2022, in the Korean Intellectual Property Office, the disclosure of which is incorporated by reference herein in its entirety.

BACKGROUND

1. Field

The disclosure relates to a microwave providing apparatus, a system including the same, and a method of manufacturing a semiconductor device.

2. Description of the Related Art

Semiconductor device manufacturing processes are performed under highly controlled parameters (e.g., temperature, air pressure, and atmosphere). Accordingly, process chambers in which the semiconductor device manufacturing processes are performed include various elements for adjusting the parameters.

Process temperatures including the temperature of wafers, the temperature of chucks supporting the wafers, the temperature of heaters embedded in chambers, and the like are representative examples of parameters and are core elements in process yield.

Microwaves introduced from the outside of chambers may be used as heat sources for precisely controlling the temperature of wafers.

SUMMARY

Provided are a microwave providing apparatus having a compact structure, a system including the same, and a method of manufacturing a semiconductor device.

Additional aspects will be set forth in part in the description which follows and, in part, will be apparent from the description, or may be learned by practice of the presented embodiments of the disclosure.

According to an aspect of the disclosure, a system includes a microwave source configured to generate microwaves, a branch apparatus including an input port connected to the microwave source, first and second chambers configured to process a wafer by using the microwaves, a first filter configured to transfer the microwaves to or cut off the microwaves from the first chamber, and connected to a first output port of the branch apparatus, and a second filter configured to transfer the microwaves to or cut off the microwaves from the second chamber, and connected to a second output port of the branch apparatus.

According to another aspect of the disclosure, a microwave providing apparatus includes a microwave source configured to generate microwaves, a first branch apparatus connected to the microwave source, and configured to split the microwaves, second and third branch apparatuses connected to the first branch apparatus, and configured to split the microwaves transferred from the first branch apparatus, a first filter connected to a first output port of the second branch apparatus, and configured to transfer the microwaves to or cut off the microwaves from a first chamber configured to process a first wafer, a second filter connected to a second output port of the second branch apparatus, and configured to transfer the microwaves to or cut off the microwaves from a second chamber configured to process a second wafer, a third filter connected to a third output port of the third branch apparatus, and configured to transfer the microwaves to or cut off the microwaves from a third chamber configured to process a third wafer, and a fourth filter connected to a fourth output port of the third branch apparatus, and configured to transfer the microwaves to or cut off the microwaves from a fourth chamber configured to process a fourth wafer.

According to another aspect of the disclosure, a method of manufacturing a semiconductor device includes etching an etching target material within a first chamber by allowing a first filter connected to the first chamber to be in a state allowing microwaves to pass through the first filter, and performing, in each of second to fourth chambers, any one of a surface change of adsorbing a first reactant on the etching target material, a first purge of introducing an inert gas to remove residue of the first reactant, and a second purge of introducing an inert gas to remove by-products generated by the etching, by allowing each of second to fourth filters connected to the second to fourth chambers to be in a state of cutting-off from the microwaves, wherein the etching of the etching target material within the first chamber includes removing the etching target material and the first reactant adsorbed on the etching target material, by using the microwaves and a second reactant.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
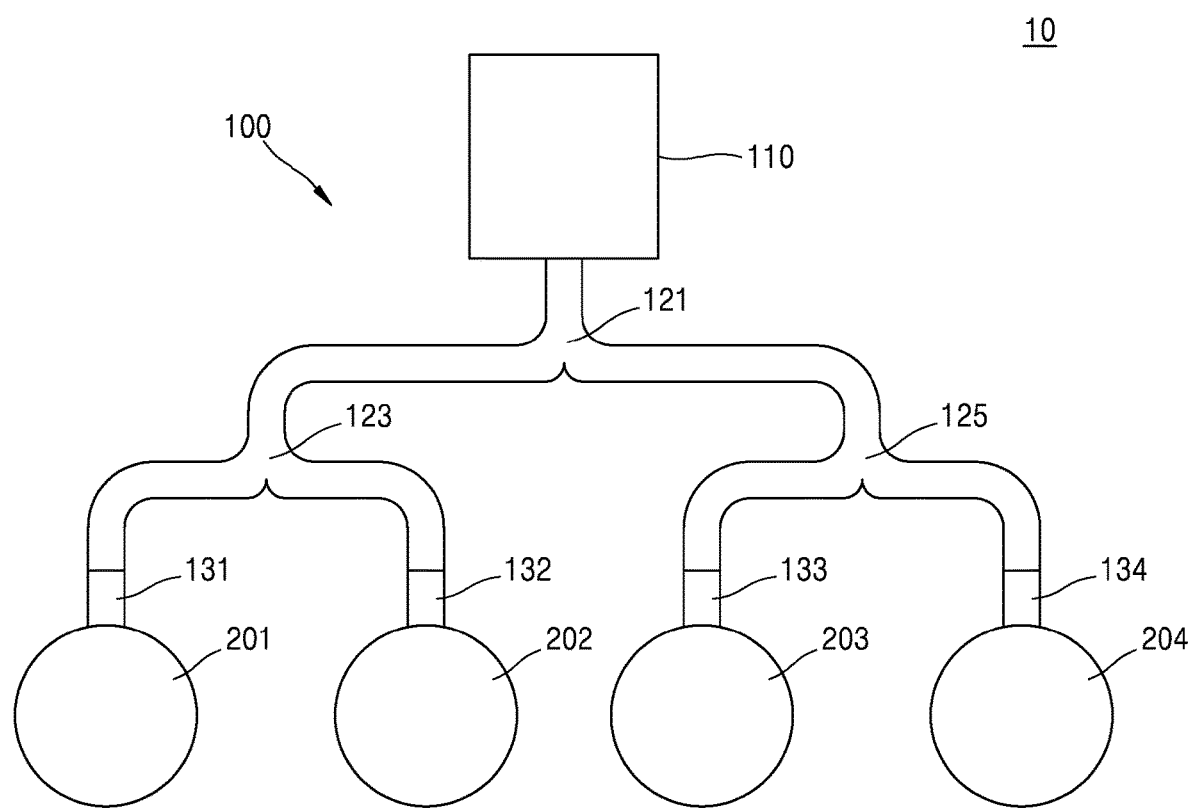
FIG. 1 is a diagram illustrating a system according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. The same reference numerals are used for the same elements in the drawings, and the same descriptions thereof will be omitted.

FIG. 1 is a diagram illustrating a system 10 according to embodiments.

Referring to FIG. 1, the system 10 may include a microwave providing apparatus 100, and first, second, third, and fourth chambers 201, 202, 203 and 204.

The system 10 is configured to process a wafer. The wafer may include, for example, SiGe, InSb, a PbTe compound, InAs, phosphide, GaAs, GaSb, or the like.

The system 10 may process the wafer by using microwaves. The processing of the wafer by the system 10 may be, for example, cyclic processing using microwaves. The processing of the wafer by the system 10 may be, for example, staggered cyclic processing using microwaves. Here, the cyclic processing may include a heating step and microwave-free steps using microwaves, which are sequentially and repeatedly performed.

In more detail, while the wafer is processed within the first chamber 201 by using the microwaves, microwave-free processing may be performed within the second, third, and fourth chambers 202, 203, and 204. While the wafer is processed within the second chamber 202 by using the microwaves, microwave-free processing may be performed within the first, third, and fourth chambers 201, 203, and 204. While the wafer is processed within the third chamber 203 by using the microwaves, microwave-free processing may be performed within the first, second, and fourth chambers 201, 202 and 204. While the wafer is processed within the fourth chamber 204 by using the microwaves, microwave-free processing may be performed within the first, second, and third chambers 201, 202, and 203.

Processes performed in the first, second, third, and fourth chambers 201, 202, 203, and 204 may include, for example, thermal atomic layer etching (hereinafter, tALE). According to embodiments, in a cyclic process such as tALE, wafer heating using microwaves is demanded for a very short time during the entire process, and the microwaves remain turned off for most of the time during the entire process. According to embodiments, the microwave providing apparatus 100 may provide the microwaves to a plurality of chambers (i.e., the first, second, third, and fourth chambers 201, 202, 203, and 204) at different timings. Accordingly, in the system 10, the plurality of chambers (i.e., the first, second, third, and fourth chambers 201, 202, 203, and 204) share the microwave providing apparatus 100, and thus, power supply apparatuses do not need to be respectively connected to the plurality of chambers (i.e., the first, second, third, and fourth chambers 201, 202, 203, and 204). Accordingly, the number of microwave providing apparatuses 100 demanded may be reduced, and space and capital execution for facilities may be reduced.

The tALE includes surface change, first purge, etching, and second purge. The tALE may be performed over a plurality of cycles. In one tALE cycle, the surface change, the first purge, the etching, and the second purge are sequentially performed, and the number of tALE cycles may be determined according to an etching target thickness.

In the surface change, a first reactant, which is also referred to as a precursor, may be adsorbed onto an etching target material on the wafer. The first reactant may be adsorbed to the etching target material on a surface of the wafer, but may not be adsorbed to an underlying material, and thus, the surface change is self-limited. In other words, the first reactant may be adsorbed only on an uppermost atomic layer of the etching target material.

For example, when the etching target material is silicon, the first reactant may be fluorine ($F_2$) or chlorine ($Cl_2$), and one uppermost atomic layer of the etching target material may be fluorinated or chlorinated. As another example, when the etching target material is polymer, the first reactant may be hexafluoro 1,3-butadiene ($C_4F_6$), and one uppermost atomic layer of the etching target material may be fluorinated. As another example, when the etching target material is alumina ($Al_2O_3$), the first reactant may be hydrofluoric acid (HF), and one uppermost atomic layer of the etching target material may be fluorinated. As another example, when the etching target material is aluminum gallium nitride ($Al_xGa_{1-x}N$, wherein x has a value of 0 to 1), the first reactant may be chlorine, and one uppermost atomic layer of the etching target material may be chlorinated. As another example, when the etching target material is indium gallium arsenide (InGaAs), the first reactant may be hydrofluoric acid, and one uppermost atomic layer of the etching target material may be fluorinated.

Subsequently, in the first purge, an inert gas may be introduced into a chamber. Extra first reactant and by-products, which are not adsorbed on the surface, may be removed.

Subsequently, in the etching, the first reactant and the etching target material may be etched by a second reactant that is also referred to as a co-reactant. The etching is also referred to as activation, and may use mechanisms, such as ligand exchange and low energy ion bombardment. While the etching is performed, the wafer may be heated by the microwaves. The second reactant desorbs only the etching target material on the surface onto which the first reactant is adsorbed, and thus, the present etching is self-limited.

For example, when the etching target material is polymer and the first reactant is hexafluoro 1, 3-butadiene ($C_4F_6$), the second reactant may be argon ions. As another example, when the etching target material is alumina and the first reactant is hydrofluoric acid, the second reactant may be trimethylaluminum ($Al(CH_3)_6$). As another example, when the etching target material is aluminum gallium nitride ($Al_xGa_{1-x}A$), wherein x has a value of 0 to 1) and the first reactant is chlorine, the second reactant may be argon ions. As another example, when the etching target material is indium gallium arsenide (InGaAs) and the first reactant is hydrofluoric acid, the second reactant may be dimethyl aluminum chloride ($AlCl(CH_3)_2$).

Subsequently, in the second purge, an inert gas may be introduced into the chamber. Accordingly, by-products by the etching may be removed.

The microwave providing apparatus 100 may provide the microwaves to only one of the first, second, third, and fourth chambers 201, 202, 203, and 204. In other words, the microwaves are not simultaneously provided to two or more of the first, second, third, and fourth chambers 201, 202, 203, and 204.

The microwave providing apparatus 100 may include a microwave source 110, first, second, and third branch apparatuses 121, 123, and 125, and first, second, third, and fourth filters 131, 132, 133, and 134.

The microwave source 110 may be driven, for example, by a high voltage power supply apparatus in a switching mode. The microwave source 110 may generate microwave power by using a compound semiconductor device such as magnetron or GaN. The microwave source 110 may include an isolator for limiting the transfer of microwaves into one direction. The microwave source 110 may include a stub tuner for impedance matching.

A frequency of the microwaves generated by the microwave source 110 may be within a range of about 0.3 GHz to about 300 GHz. The frequency of the microwaves generated by the microwave source 110 may be about 2.45 GHz.

The first branch apparatus 121 may be connected to the microwave source 110. The first branch apparatus 121 may be directly connected to the microwave source 110, or a waveguide may be located between the first branch apparatus 121 and the microwave source 110. The first branch apparatus 121 may split the microwaves transferred from the microwave source 110 and transfer the split microwaves to the second and third branch apparatuses 123 and 125. The first branch apparatus 121 may include any two-way splitter such as a Y splitter.

The second and third branch apparatuses 123 and 125 may be connected to the first branch apparatus 121. The second and third branch apparatuses 123 and 125 may be directly connected to the first branch apparatus 121, or a waveguide may be located between the second and third branch apparatuses 123 and 125 and the first branch apparatus 121. Each of the second and third branch apparatuses 123 and 125 may split and transfer the microwaves transferred from the microwave source 110. The second and third branch apparatuses 123 and 125 may include any two-way splitters such as Y splitters.

The second branch apparatus 123 may be connected to the first and second chambers 201 and 202. The first filter 131 may be located between the second branch apparatus 123 and the first chamber 201. The second filter 132 may be located between the second branch apparatus 123 and the second chamber 202.

The third branch apparatus 125 may be connected to the third and fourth chambers 203 and 204. The third filter 133 may be located between the third branch apparatus 125 and the third chamber 203. The fourth filter 134 may be located between the third branch apparatus 125 and the fourth chamber 204.

In other words, a first input port of the first branch apparatus 121 may be connected to the microwave source 110, and output ports of the first branch apparatus 121 may be connected to the second and third branch apparatuses 123 and 125, respectively. A second input port of the second branch apparatus 123 and a third input port of the third branch apparatus 125 may be connected to the output ports of the first branch apparatus 121. A first output port of the second branch apparatus 123 may be connected to the first chamber 201, a second output port of the second branch apparatus 123 may be connected to the second chamber 202, a third output port of the third branch apparatus 125 may be connected to the third chamber 203, and a fourth port of the third branch apparatus 125 may be connected to the fourth chamber 204.

Although an embodiment in which each of the first, second, and third branch apparatuses 121, 123, and 125 is a 2-way splitter has been described above, those skilled in the art may easily reach, on the basis of the description, an embodiment in which each of the first, second, and third branch apparatuses 121, 123, and 125 is an n-way (wherein, n is an integer greater than or equal to 3).

The first, second, third, and fourth filters 131, 132, 133, and 134 may sequentially transfer microwaves to or cut off the microwaves from the first, second, third, and fourth chambers 201, 202, 203, and 204, respectively. The first, second, third, and fourth filters 131, 132, 133, and 134 may adjust a frequency range of a passband. Each of the first, second, third, and fourth filters 131, 132, 133, and 134 may be a variable filter having a variable cut-off frequency. The first, second, third, and fourth filters 131, 132, 133, and 134 may be in a passing state or a cut-off state with respect to the microwaves.

For example, the first, second, third, and fourth filters 131, 132, 133, and 134 may be variable low-pass filters. In this case, when the first, second, third, and fourth filters 131, 132, 133, and 134 are in the passing state with respect to the microwaves, a cut-off frequency of the first, second, third, and fourth filters 131, 132, 133, and 134 may be higher than a frequency of the microwaves. When the first, second, third, and fourth filters 131, 132, 133, and 134 are in the cut-off state with respect to the microwaves, the cut-off frequency of the first, second, third, and fourth filters 131, 132, 133, and 134 may be lower than the frequency of the microwaves.

As another example, the first, second, third, and fourth filters 131, 132, 133, and 134 may be variable high-pass filters. In this case, when the first, second, third, and fourth filters 131, 132, 133, and 134 are in the passing state with respect to the microwaves, the cut-off frequency of the first, second, third, and fourth filters 131, 132, 133, and 134 may be lower than the frequency of the microwaves. When the first, second, third, and fourth filters 131, 132, 133, and 134 are in the cut-off state with respect to the microwaves, the cut-off frequency of the first, second, third, and fourth filters 131, 132, 133, and 134 may be higher than the frequency of the microwaves.

As another example, the first, second, third, and fourth filters 131, 132, 133, and 134 may be variable band-pass filters. In this case, the first, second, third, and fourth filters 131, 132, 133, and 134 may pass a signal in a pass band between a first cut-off frequency and a second cut-off frequency that is greater than the first cut-off frequency. When the first, second, third, and fourth filters 131, 132, 133, and 134 are in the passing state with respect to the microwaves, the frequency of the microwaves may be higher than the first cut-off frequency of the first, second, third, and fourth filters 131, 132, 133, and 134, and may be lower than the second cut-off frequency of the first, second, third, and fourth filters 131, 132, 133, and 134. When the first, second, third, and fourth filters 131, 132, 133, and 134 are in the cut-off state with respect to the microwaves, the frequency of the microwaves may be lower than the first cut-off frequency of the first, second, third, and fourth filters 131, 132, 133, or 134, or may be higher than the second cut-off frequency of the first, second, third, and fourth filters 131, 132, 133, and 134.

As another example, the first, second, third, and fourth filters 131, 132, 133, and 134 may be variable band rejection filters. In this case, the first, second, third, and fourth filters 131, 132, 133, and 134 may cut off a signal in a rejection band between the first cut-off frequency and the second cut-off frequency that is greater than the first cut-off frequency. When the first, second, third, and fourth filters 131, 132, 133, and 134 are in the passing state with respect to the microwaves, the frequency of the microwaves may be lower than the first cut-off frequency of the first, second, third, and fourth filters 131, 132, 133, or 134, or may be higher than the second cut-off frequency of the first, second, third, and fourth filters 131, 132, 133, and 134. When the first, second, third, and fourth filters 131, 132, 133, and 134 are in the cut-off state with respect to the microwaves, the frequency of the microwaves may be higher than the first cut-off frequency of the first, second, third, and fourth filters 131, 132, 133, and 134, and may be lower than the second cut-off frequency of the first, second, third, and fourth filters 131, 132, 133, and 134.

According to embodiments, the microwave providing apparatus 100 may further include a controller configured to control the first, second, third, and fourth filters 131, 132, 133, and 134. The controller may be configured to generate a signal for switching each of the first, second, third, and fourth filters 131, 132, 133, and 134 to the passing state or the cut-off state. The first, second, third, and fourth filters 131, 132, 133, and 134 may be electronically controlled by the signal generated by the controller.

According to embodiments, the controller may be implemented in hardware, firmware, software, or any combination thereof. For example, the controller may include a computing apparatus, such as a workstation computer, a desktop computer, a laptop computer, a tablet computer, or the like. The controller may include a simple controller, a complex processor, such as a microprocessor, a central processing unit (CPU), or graphics processing unit (GPU), a processor configured by software, or dedicated hardware or firmware. The controller may be implemented, for example, by a general-purpose computer, or application-specific hardware such as a digital signal processor (DSP), field programmable gate array (FPGA), and an application specific integrated circuit (ASIC).

According to some embodiments, an operation of the controller may be implemented as instructions stored on a machine-readable medium, which may be read and executed by one or more processors. Here, the machine-readable medium may include any mechanism for storing and/or transmitting information in a readable form by a machine (e.g., a computing apparatus). For example, the machine-readable medium may include read only memory (ROM), random access memory (RAM), a magnetic disk storage medium, an optical storage medium, flash memory devices, electrical, optical, acoustic, or other forms of radio signals (e.g., carrier, infrared signals, digital signals, and the like), and any other signals.

Firmware, software, routines, and instructions may also be configured to perform the operation described for the controller or any process described below. However, the above configuration is for convenience of description, and the operation of the controller described above may also be derived from other apparatuses that execute computing apparatuses, processors, firmware, software, routines, instructions, and the like.

Figure 2:
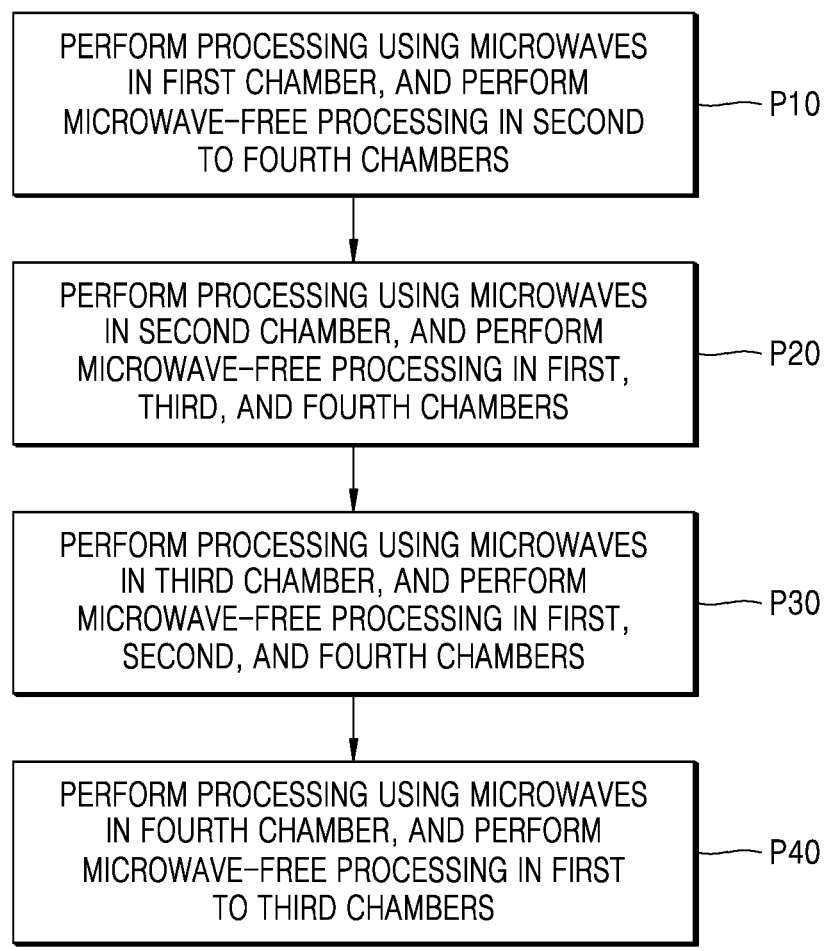
FIG. 2 is a flowchart illustrating a method of manufacturing a semiconductor device, according to embodiments.

FIG. 2 is a flowchart illustrating a method of manufacturing a semiconductor device, according to embodiments.

Referring to FIGS. 1 and 2, in P10, processing using microwaves may be performed in the first chamber 201, and microwave-free processing may be performed in the second, third, and fourth chambers 202, 203, and 204. For example, etching of tALE may be performed in the first chamber 201, first purge of the tALE may be performed in the second chamber 202, surface change of the tALE may be performed in the third chamber 203, and second purge of the tALE may be performed in the fourth chamber 204. Accordingly, only the first chamber 201 may demand the microwaves, and the microwaves may be transferred only to the first chamber 201.

In P20, processing using the microwaves may be performed in the second chamber 202, and microwave-free processing may be performed in the first, third, and fourth chambers 201, 203, and 204. For example, the etching of the tALE may be performed in the second chamber 202, the first purge of the tALE may be performed in the third chamber 203, the surface change of the tALE may be performed in the fourth chamber 204, and the second purge of the tALE may be performed in the first chamber 201. Accordingly, only the second chamber 202 may demand the microwaves, and the microwaves may be transferred only to the second chamber 202.

In P30, processing using the microwaves may be performed in the third chamber 203, and microwave-free processing may be performed in the first, second, and fourth chambers 201, 202, and 204. For example, the etching of the tALE may be performed in the third chamber 203, the first purge of the tALE may be performed in the fourth chamber 204, the surface change of the tALE may be performed in the first chamber 201, and the second purge of the tALE may be performed in the second chamber 202. Accordingly, only the third chamber 203 may demand the microwaves, and the microwaves may be transferred only to the third chamber 203.

In P40, processing using the microwaves may be performed in the fourth chamber 204, and microwave-free processing may be performed in the first, second, and third chambers 201, 202, and 203. For example, the etching of the tALE may be performed in the fourth chamber 204, the first purge of the tALE may be performed in the first chamber 201, the surface change of the tALE may be performed in the second chamber 202, and the second purge of the tALE may be performed in the third chamber 203. Accordingly, only the fourth chamber 204 may demand microwaves, and the microwaves may be transferred only to the fourth chamber 204.

According to the disclosure, microwaves may be provided to a plurality of chambers by using one microwave providing apparatus. Accordingly, a space of limited production facilities may be saved, and unneeded capital expenditures may be prevented.

Effects that may be obtained in embodiments are not limited to the above-mentioned effects, and other effects not mentioned may be clearly derived and understood from the following description by those skilled in the art to which the embodiments belong. In other words, unintended effects according to implementation of the embodiments may also be derived from the embodiments by those skilled in the art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A system comprising:
   a microwave source configured to generate microwaves;
   a branch apparatus including an input port connected to the microwave source;
   first and second chambers configured to process a wafer by using the microwaves;
   a first filter configured to transfer the microwaves to or cut off the microwaves from the first chamber, and connected to a first output port of the branch apparatus; and
   a second filter configured to transfer the microwaves to or cut off the microwaves from the second chamber, and connected to a second output port of the branch apparatus.

2. The system of claim 1,
   wherein each of the first and second chambers is configured to perform thermal atomic layer etching.

3. The system of claim 1,
   wherein the second chamber is configured to perform microwave-free processing while the first chamber performs processing using the microwaves, and
   the first chamber is configured to perform microwave-free processing while the second chamber performs processing using the microwaves.

4. The system of claim 1, further comprising a controller configured to control the first and second filters, wherein the controller is configured to control the first filter to allow the microwaves to pass therethrough and the second filter to cut off the microwaves, or control the first filter to cut off the microwaves and the second filter to allow the microwaves to pass therethrough.

5. The system of claim 1, wherein each of the first filter and the second filter includes any one of a variable low-pass filter, a variable high-pass filter, a variable band-pass filter, and a variable band rejection filter.

6. The system of claim 5, wherein each of the first filter and the second filter includes the variable low-pass filter, when each of the first filter and the second filter is in a passing state, a cut-off frequency of each of the first and second filters is greater than a frequency of the microwaves, and when each of the first filter and the second filter is in a cut-off state, the cut-off frequency of each of the first and second filters is less than the frequency of the microwaves.

7. The system of claim 5, wherein each of the first filter and the second filter includes the variable high-pass filter, when each of the first filter and the second filter is in a passing state, a cut-off frequency of each of the first and second filters is less than a frequency of the microwaves, and when each of the first filter and the second filter is in a cut-off state, the cut-off frequency of each of the first and second filters is greater than the frequency of the microwaves.

8. The system of claim 5, wherein each of the first filter and the second filter includes the variable band pass filter, wherein the variable band pass filter has a first cut-off frequency and a second cut-off frequency greater than the first cut-off frequency, and allows a signal in a passband between the first cut-off frequency and the second cut-off frequency to pass therethrough, when each of the first filter and the second filter is in a passing state, a frequency of the microwaves is greater than the first cut-off frequency and less than the second cut-off frequency, and when each of the first filter and the second filter is in a cut-off state, the frequency of the microwaves is less than the first cut-off frequency or greater than the second cut-off frequency.

9. The system of claim 5, wherein each of the first filter and the second filter includes the variable band rejection filter, wherein the variable band-pass filter has a first cut-off frequency and a second cut-off frequency greater than the first cut-off frequency, and cuts off a signal in a rejection band between the first cut-off frequency and the second cut-off frequency, when each of the first filter and the second filter is in a passing state, a frequency of the microwaves is less than the first cut-off frequency or greater than the second cut-off frequency, and when each of the first filter and the second filter is in a cut-off state, the frequency of the microwaves is greater than the first cut-off frequency and less than the second cut-off frequency.

10. A microwave providing apparatus comprising:
a microwave source configured to generate microwaves;
a first branch apparatus connected to the microwave source, and configured to split the microwaves;
second and third branch apparatuses connected to the first branch apparatus, and configured to split the microwaves transferred from the first branch apparatus;
a first filter connected to a first output port of the second branch apparatus, and configured to transfer the microwaves to or cut off the microwaves from a first chamber configured to process a first wafer;
a second filter connected to a second output port of the second branch apparatus, and configured to transfer the microwaves to or cut off the microwaves from a second chamber configured to process a second wafer;
a third filter connected to a third output port of the third branch apparatus, and configured to transfer the microwaves to or cut off the microwaves from a third chamber configured to process a third wafer;
a fourth filter connected to a fourth output port of the third branch apparatus, and configured to transfer the microwaves to or cut off the microwaves from a fourth chamber configured to process a fourth wafer; and
a controller configured to independently control each of the first to fourth filters to allow or block microwave transmission based on process timing or frequency,
wherein at a given time, only one of the first to fourth filters is in a passing state and the others are in a cutoff state.

11. The microwave providing apparatus of claim 10, wherein the microwaves are transferred to only one of the first to fourth chambers.

12. The microwave providing apparatus of claim 10, wherein, while the first chamber processes the first wafer by using the microwaves, the second to fourth chambers perform microwave-free processing.

13. The microwave providing apparatus of claim 10, wherein each of the first to fourth filters includes any one of a variable low-pass filter, a variable high-pass filter, a variable band-pass filter, and a variable band rejection filter.

14. The microwave providing apparatus of claim 10, wherein the first to fourth chambers perform thermal atomic layer etching on the first to fourth wafers.

15. The microwave providing apparatus of claim 14, wherein different operations of the thermal atomic layer etching are performed in the first to fourth chambers.

16. The microwave providing apparatus of claim 14, wherein, while a surface change in which a first reactant is adsorbed on an etching target material is performed in the first chamber, first purge of introducing an inert gas to remove residue of the first reactant is performed in the second chamber, etching for removing the etching target material and the first reactant adsorbed on the etching target material, by using the microwaves and a second reactant, is performed in the third chamber, and second purge of introducing an inert gas to remove by-products generated by the etching is performed in the fourth chamber.

17. The microwave providing apparatus of claim 16, wherein, while the first purge is performed in the first chamber, the etching is performed in the second chamber, the second purge is performed in the third chamber, and the surface change is performed in the fourth chamber.

18. The microwave providing apparatus of claim 17, wherein, while the etching is performed in the first chamber, the second purge is performed in the second chamber, the surface change is performed in the third chamber, and the first purge is performed in the fourth chamber.

19. The microwave providing apparatus of claim 18, wherein, while the second purge is performed in the first chamber, the surface change is performed in the second chamber, the first purge is performed in the third chamber, and the etching is performed in the fourth chamber.

* * * * *